US009229077B2

(12) United States Patent
Cunningham et al.

(10) Patent No.: US 9,229,077 B2
(45) Date of Patent: Jan. 5, 2016

(54) SYSTEM AND METHOD FOR SPATIALLY ENCODING NUCLEAR MAGNETIC RESONANCE SIGNALS USING MAGNETIC SUSCEPTIBILITY EFFECTS

(75) Inventors: Charles H Cunningham, Toronto, CA (US); Hirad Karimi, Toronto, CA (US)

(73) Assignee: SUNNYBROOK HEALTH SCIENCES CENTRE, Toronto (CA)

( * ) Notice: Subject to any disclaimer, the term of this patent is extended or adjusted under 35 U.S.C. 154(b) by 562 days.

(21) Appl. No.: 13/453,396

(22) Filed: Apr. 23, 2012

(65) Prior Publication Data

US 2012/0268127 A1 Oct. 25, 2012

Related U.S. Application Data (60) Provisional application No. 61/478,122, filed on Apr. 22, 2011.

(51) Int. Cl.
  *G01R 33/385* (2006.01)
  *G01R 33/28* (2006.01)
  (Continued)

(52) U.S. Cl.
  CPC ............ *G01R 33/385* (2013.01); *G01R 33/285* (2013.01); *G01R 33/56509* (2013.01); *G01R 33/34084* (2013.01)

(58) Field of Classification Search
  CPC ............... G01R 33/285; G01R 33/385; G01R 33/34084; G01R 33/56509
  See application file for complete search history.

(56) References Cited

U.S. PATENT DOCUMENTS 4,731,239 A * 3/1988 Gordon ......................... 424/9.32
5,352,979 A * 10/1994 Conturo ......................... 324/307
6,332,088 B1 * 12/2001 Zhang et al. .................. 600/410
(Continued)

FOREIGN PATENT DOCUMENTS

EP  0775500 A1  5/1997
WO  9717622 A1  5/1997
(Continued)

OTHER PUBLICATIONS

Anderson, et al., Active Visualization of MR-Compatible Guidewires, Proc. Intl. Soc. Mag. Reson. Med., 2009, 17:2569.
(Continued)

*Primary Examiner* — Dixomara Vargas
(74) *Attorney, Agent, or Firm* — Jonathan D. Stone; Quarles & Brady, LLP (57) ABSTRACT

A device for spatially encoding nuclear magnetic resonance signals is provided. The device includes a plurality of spatial-encoding elements configured to produce a spatial-encoding magnetic field in the presence of an external magnetic field, such as the main magnetic field of a magnetic resonance imaging ("MRI") system. The spatial-encoding elements include paramagnetic and diamagnetic spatial-encoding elements. The device further includes a support configured to hold the plurality of spatial-encoding elements in a fixed arrangement. By adjusting the orientation of the device, the spatial-encoding elements are moved relative to each other and thereby produce a plurality of different spatial-encoding magnetic fields. These spatial-encoding magnetic fields are used to spatially encode nuclear magnetic resonance signals emanating from spins in a volume-of-interest adjacent the device. An image reconstruction method for reconstructing images from signals spatially-encoded with the device is also provided.

20 Claims, 9 Drawing Sheets (51) Int. Cl.
*G01R 33/565* (2006.01)
*G01R 33/34* (2006.01)

(56) References Cited

U.S. PATENT DOCUMENTS

| | | | | |
|---|---|---|---|---|
| 6,400,153 | B1* | 6/2002 | Heid | 324/312 |
| 6,477,398 | B1* | 11/2002 | Mills | 600/409 |
| 6,846,985 | B2* | 1/2005 | Wang et al. | 174/391 |
| 6,864,418 | B2* | 3/2005 | Wang et al. | 174/391 |
| 6,980,865 | B1* | 12/2005 | Wang et al. | 607/121 |
| 7,473,843 | B2* | 1/2009 | Wang et al. | 174/36 |
| 7,474,097 | B2* | 1/2009 | Bydder et al. | 324/307 |
| 7,683,614 | B2* | 3/2010 | Posse | 324/307 |
| 8,676,295 | B2 | 3/2014 | Cunningham et al. | |

FOREIGN PATENT DOCUMENTS

| | | |
|---|---|---|
| WO | 0033099 A1 | 6/2000 |
| WO | 2011075839 A1 | 6/2011 |

OTHER PUBLICATIONS

Bock, et al., MR-Guided Intravascular Interventions: Techniques and Applications, Journal of Magnetic Resonance Imaging, 2008, 27(2):326-338.

Karimi, et al., Spatial Encoding Without Gradient Coils Using Field Perturbations From Susceptibility Markers, Proc. Intl. Soc. Mag. Reson. Med., 2011, 19:2810.

Kos, et al., MR-Guided Endovascular Interventions: A Comprehensive Review on Techniques and Applications, European Radiology, 2008, 18(4):645-657.

Lam, et al., Guidewire Tip Design With Selectively Enabled Magnetic Field Perturbation, Proc. Intl. Soc. Mag. Reson. Med., 2010, 18:1854.

Ozturk, et al., Magnetic Resonance Imaging-Guided Vascular Interventions, Top Magn. Reson. Imaging, 2005, 16 (5):369-381.

Pauly, et al., Parameter Relations for the Shinnar-Le Roux Selective Excitation Pulse Design Algorithm, IEEE Transactions on Medical Imaging, 1991, 10(1):53-65.

Rivas, et al., In Vivo Real-Time Intravascular MRI, Journal of Cardiovascular Magnetic Resonance, 2002, 4 (2):223-232.

Schenck, The Role of Magnetic Susceptibility in Magnetic Resonance Imaging: MRI Magnetic Compatibility of the First and Second Kinds, Medical Physics, 1996, 23(6):815-850.

Zhang, et al., Real-Time MR Navigation and Localization of an Intravascular Catheter With Ferromagnetic Components, Magnetic Resonance Materials in Physics, Biology and Medicine, 2010, 23(3):153-163.

PCT International Search Report and Written Opinion, PCT/CA2012/050258, Jun. 20, 2012, 12 pages.

\* cited by examiner

SYSTEM AND METHOD FOR SPATIALLY ENCODING NUCLEAR MAGNETIC RESONANCE SIGNALS USING MAGNETIC SUSCEPTIBILITY EFFECTS

CROSS-REFERENCE TO RELATED APPLICATIONS

This application claims the benefit of U.S. Provisional Patent Application Ser. No. 61/478,122, filed on Apr. 22, 2011, and entitled "SYSTEM AND METHOD FOR MAGNETIC RESONANCE IMAGING."

BACKGROUND OF THE INVENTION

The field of the invention is systems and methods for spatially encoding nuclear magnetic resonance signals, such as may be used in magnetic resonance imaging ("MRI").

Interventional procedures such as the crossing of chronic total occlusions ("CTOs") using a wire could benefit a great deal from new imaging methods that enable the visualization of the device and the vessel wall during the procedure. This would be an improvement over the current x-ray methods for which the vessel is not visible due to a lack of blood flow. MRI has been proposed as a solution, but has not yet become widely used. One problem with using MRI for these applications is that there is a lack of interventional devices that enable imaging at the high spatial resolution required to adequately image the vessel wall and lumen.

In conventional MRI systems, magnetic field gradients are established to spatially encode nuclear magnetic resonance signals emanating from the volume-of-interest being imaged. These magnetic field gradients are stationary relative to physiologic movements occurring within the volume-of-interest. Thus, compensation for this motion either must be performed prospectively by limiting the times at which data is acquired to those times when little to no motion is occurring, or must be performed retrospectively by correcting the acquired data for the effects of the motion that occurred during data acquisition. In cardiac MRI, compensation for motion typically requires data acquisition during short quiescent periods where the heart is approximately motionless.

These limitations and problems are removed if the magnetic field gradients used to spatially-encode the nuclear magnetic resonance signals are able to move with the physiologic motion, such that a local frame of reference is created. Thus, there is a need to provide a system and method for spatially-encoding nuclear magnetic resonance signals in a local frame of reference, such as one that is allowed to move separately from an MRI system.

SUMMARY OF THE INVENTION

The present invention overcomes the aforementioned drawbacks by providing a device for spatially encoding nuclear magnetic resonance signals that is capable of moving with local motion sources while producing spatial-encoding magnetic fields, thereby resulting in the spatial encoding of these signals in a local frame of reference free of the local motion sources. By way of example, such local motion sources may include physiological motion. The present invention is also useful for other magnetic resonance imaging and spectroscopy applications in which it is advantageous to spatially-encode and acquire data from a local frame of reference that moves along with the device making the measurements. An example of such other applications includes oil well logging applications.

It is an aspect of the invention to provide a device for spatially-encoding nuclear magnetic resonance signals. The device includes a plurality of spatial-encoding elements configured to produce a spatial-encoding magnetic field in the presence of an external magnetic field. The plurality of spatial-encoding elements include at least one paramagnetic spatial-encoding element and at least one diamagnetic spatial-encoding element. The device further includes a support that is coupled to the plurality of spatial-encoding elements. The support is configured to space the plurality of spatial-encoding elements in a fixed arrangement and is also configured to move the spatial-encoding elements relative to each other in order to produce a plurality of different spatial-encoding magnetic fields in the presence of an the external magnetic field.

It is another aspect of the invention that the spatial-encoding elements may be shaped as spheres, spherical frustums, cones, conical frustums, circular discs, and the like.

It is yet another aspect of the invention that the device may include a radio frequency receiver coil coupled to the support and configured to receive nuclear magnetic resonance signals from a volume-of-interest adjacent the support.

It is yet another aspect of the invention that the device may include a rotation tracking system to measure a rotation of the device about its longitudinal axis. Thus, the device may include marks that indicate a rotational orientation of the support with respect to rotation about the longitudinal axis. The device may include an optical device coupled to the support and configured to identify the rotational orientation of the support by analyzing the marks. The device may include an optical fiber that couples the optical device to the support. The device may also include a sheath disposed about the support and configured to hold the optical fiber in a fixed position with respect to the support.

It is yet another aspect of the invention that the device may include a tracking system coupled to the support. Such a tracking system is configured to measure a yaw angle and a pitch angle of the device with respect to the external magnetic field. An example of a tracking system includes a first tracking member having a first magnetic susceptibility and a second tracking member having a second magnetic susceptibility different than the first magnetic susceptibility. The first tracking member is configured to be moved relative to the second tracking member, thereby altering local magnetic fields produced by the tracking system when the tracking system is positioned in the external magnetic field.

It is also an aspect of the invention to provide a method for producing images of a volume-of-interest with a magnetic resonance imaging ("MRI") system using a device that includes spatial-encoding elements that produce spatial-encoding magnetic fields when exposed to a main magnetic field of the MRI system. The method includes providing the device to the volume-of-interest within the MRI system and operating the device to adjust the device into a configuration that produces a spatial-encoding magnetic field in response to a main magnetic field of the MRI system. The MRI system is used to acquire signal data from spins adjacent the device, in which the signal data is spatially encoded by the spatial-encoding magnetic field produced by the device. The foregoing steps are repeated while adjusting the configuration of the device to produce different spatial-encoding magnetic fields. An image of the volume-of-interest is then reconstructed from the acquired signal data.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

When exposed to an external magnetic field, such as the main magnetic field, $B_0$, of an MRI system, paramagnetic materials become magnetized such that their magnetization is oriented in the same direction as the external magnetic field. Conversely, diamagnetic materials become magnetized such that their magnetization is oriented opposite the direction of the external magnetic field. This magnetization of paramagnetic and diamagnetic materials results in magnetic field perturbations. As an example, for a spherical object composed of a material with magnetic susceptibility, $\chi$, placed in the main magnetic field, $B_0$, of an MRI system will produce a magnetic field perturbation, $\Delta B_z$, as follows:

$$\Delta B_z = \frac{\Delta \chi B_0 a^3}{3} \cdot \frac{2z^2 - x^2}{(x^2 + z^2)^{5/2}}; \quad (1)$$

where a is the radius of the spherical object and $\chi$ is the volume susceptibility of the spherical object.

Figure 4:
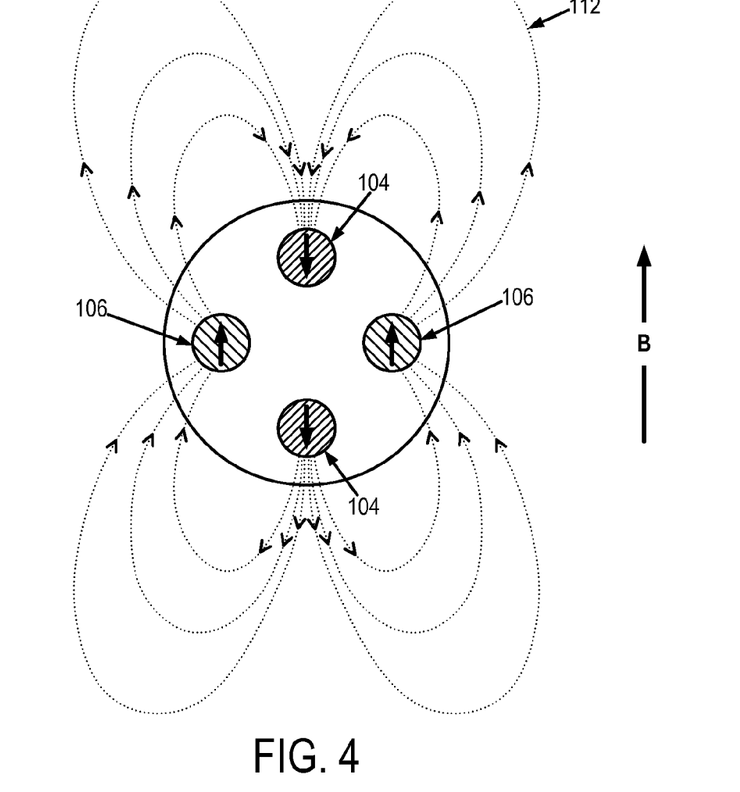
FIG. 4 is a pictorial representation of magnetic fields produced by the device of FIG. 1 in the presence of an external magnetic field, B.

It is an aspect of the present invention that objects with different magnetic susceptibilities can be arranged in certain configurations such that specific magnetic field perturbations will be generated when the objects are positioned within an external magnetic field. The inhomogeneous magnetic fields resulting from these magnetic field perturbations may then be used to spatially encode nuclear magnetic resonance signals; thus, when objects of different magnetic susceptibilities are so arranged, they may be referred to as spatial-encoding elements. By way of example, these spatial-encoding elements are incorporated into a device to allow the spatial localization of nuclear magnetic resonance signals generated in a volume-of-interest adjacent the device. The generated field perturbations will depend on the angle of such a device with respect to the external magnetic field in which it is positioned. An example of the magnetic fields produced by such spatial-encoding elements is illustrated in FIG. 4.

The aforementioned magnetic field perturbations will change as the device is rotated about a roll axis by a roll angle, θ. Thus, by way of example, the device may be rotated through 360 degrees in a series of angular steps. At each angular step, spins in the volume-of-interest adjacent the device may be excited and a resulting nuclear magnetic resonance signal acquired. The device is rotated again by the angular step and more signals are acquired. By rotating the device through 360 degrees, sufficient information can be acquired to reconstruct an image of a volume-of-interest adjacent the device.

The signal value at each time point is the summation of all small signals from a continuous medium:

$$s(\theta_k, t_l) = \int_x \int_y \int_z C(\theta_k, x, y, z) \rho(x, y, z) e^{-i\omega(\theta_k, x, y, z) t_l} dx\, dy\, dz = s_{kl} \quad (2);$$

where $\rho(x,y,z)$ is the spin density of the medium; $C(\theta_k, x, y, z)$ is a time-independent scaling coefficient that incorporates flip-angle variations that may result from the excitation profile of the RF excitation pulse, the coil sensitivity profile, and so on; and $\omega(\theta_k, x, y, z)$ is the three-dimensional angular frequency distribution due to the magnetic field perturbations generated by the spatial-encoding elements.

The linear relationship between signal and magnetization provides the a reconstruction process that is equivalent to finding a decoding matrix, F, that produces a magnetization vector with elements $\tilde{\rho}_n$, where n=1, 2, ..., N for N voxels in the three-dimensional reconstruction grid. The reconstruction process using the decoding matrix, F, for voxel $\tilde{\rho}_n$ is given by the following equation:

$$\tilde{\rho}_n = \sum_k \sum_l F(\rho_n, \theta_k, t_l) s_{kl}. \quad (3)$$

Because the spatial-encoding fields generated by the spatial-encoding elements are nonlinear and non-bijective, the for a reconstructed voxel may be contaminated by signals from neighboring voxels. The spatial distribution of the signal that contributes to a particular reconstructed voxel, $\tilde{\rho}_n$, can be characterized by a spatial response function ("SRF") of the voxel:

$$SRF_n(x, y, z) = \sum_k \sum_l F(\rho_n, \theta_k, t_l) e^{-i\omega(\theta_k, x, y, z) t_l} \qquad (4)$$

where $\exp(-i\omega(\theta_k,x,y,z)t_l)$ is the phase of the magnetization for roll angle $\theta_k$ and time point $t_l$. Practically, the SRF may be viewed as a linear combination of these phase maps.

As an example, the reconstruction technique may be viewed as computing the rows of the decoding matrix, $F_{nkl}$, for $n=1, \ldots, N$, such that the SRF for each voxel is well localized to that voxel. Each row of the decoding matrix may then be used to compute the intensity of one voxel of the final reconstructed image using Eqn. (3). The rows of the decoding matrix may be calculated in one of at least two ways.

One approach for calculating the coefficients of the decoding matrix involves generating an approximation of an encoding matrix, E, from discretized phase evolution maps. An example of such an encoding matrix, E, is as follows:

$$E = \begin{bmatrix} C(r_1)e^{-i\omega_1(r_1)t_1} & C(r_2)e^{-i\omega_1(r_2)t_1} & \ldots & C(r_N)e^{-i\omega_1(r_N)t_1} \\ C(r_1)e^{-i\omega_1(r_1)t_2} & C(r_2)e^{-i\omega_1(r_2)t_2} & \ldots & C(r_N)e^{-i\omega_1(r_N)t_2} \\ \vdots & \vdots & \ddots & \vdots \\ C(r_1)e^{-i\omega_1(r_1)t_L} & C(r_2)e^{-i\omega_1(r_2)t_L} & \ldots & C(r_N)e^{-i\omega_1(r_N)t_L} \\ C(r_1)e^{-i\omega_2(r_1)t_1} & C(r_2)e^{-i\omega_2(r_2)t_1} & \ldots & C(r_N)e^{-i\omega_2(r_N)t_1} \\ \vdots & \vdots & \ddots & \vdots \\ C(r_1)e^{-i\omega_K(r_1)t_L} & C(r_2)e^{-i\omega_K(r_2)t_L} & \ldots & C(r_N)e^{-i\omega_K(r_N)t_L} \end{bmatrix} ; \qquad (5)$$

where $r_n$ is the locations of a group of N spatial points that are to be reconstructed, which can be expressed as the following:

$$r_1 = (x_1, y_1, z_1) \qquad (6)$$
$$r_2 = (x_2, y_2, z_2)$$
$$\vdots$$
$$r_N = (x_N, y_N, z_N).$$

The encoding matrix, E, provided in Eqn. (5) assumes that there are N discrete voxels in the reconstructed image, that signals were acquired for K different roll angles, and that signals were recorded at L discrete sample times ending at $t_L$. Elements of the encoding matrix may be calculated using a discrete representation of magnetic field perturbations surrounding the spatial-encoding elements. By way of example, the elements of the encoding matrix may be calculated for a two-dimensional plane of voxels located two millimeters in front of the spatial-encoding elements. It will be appreciated by those skilled in the art that this approach can be extended to three spatial dimensions, and that it is important to have elements in the encoding matrix that correspond to all of the spatial locations that contribute to the signal.

If the N points, $r_N$, adequately cover the volume that contributes signal to $s(\theta_k,t_l)$, then a good numerical approximation, $\tilde{s}(\theta_k,t_l)$, of this signal can be given by the following equation:

$$\tilde{s}_{kl} = E_{kln} \tilde{\rho}_n \qquad (7).$$

The signal values, $\tilde{s}_{kl}$, at each time point, $t_l$, for each roll angle, $\theta_k$, are calculated by multiplying one row of the encoding matrix $$E_{kl} = [C(\theta_k, r_1)e^{-i\omega k(r1)t_l} C(\theta_k, r_2)e^{-i\omega k(r2)t_l} \ldots \\ C(\theta_k, r_N)e^{-\omega k(rN)t_l}]_{1 \times N} \qquad (8);$$

by the magnetization density vectors, $\tilde{\rho}$. In reality, the signal values at each time point will be a summation of all small signals from a continuous medium, as shown in Eqn. (2); thus, Eqn. (7) is a discretization of the continuous signal equation.

Because spatial encoding is a linear process, the reconstructed image voxel values, arranged as a vector in $\tilde{\rho}$, can be computed by solving a system of over-determined linear equations:

$$\tilde{s} = E\tilde{\rho} \qquad (9);$$

or equivalently by computing the decoding matrix:

$$\tilde{\rho} = F\tilde{s} \qquad (10).$$

If the spatial-encoding magnetic fields are linear, Eqns. (9) and (10) could be solved by performing a Fourier transform on the acquired signals. However, because of the nonlinear nature of the spatial-encoding magnetic fields, there is no one-to-one relationship between the acquired signals and spatial frequencies. Therefore, a k-space representation of the acquired signals will not be applicable in this technique. The encoding matrix, E, of Eqn. (5) is usually ill-conditioned, so taking the pseudo-inverse of the encoding matrix to compute the decoding matrix, F, will typically result in a poor image reconstruction. To improve upon this result, a cascade regularization technique may be used to reduce the ill-posed nature of the encoding matrix. In addition, to improve the accuracy of the image reconstruction process, truncated singular value decomposition ("TSVD") and Tikhonov regularization may be used.

The reconstruction technique described above is considered a forward-problem solution for the spatial-encoding technique provided by the present invention. As described earlier, there is signal contamination in a reconstructed voxel that originates from other spatial locations. In the forward-problem solution described above, each element of the encoding matrix is an average of the evolved phase over the corresponding voxel, and this assumption will fail when a sharp gradient in the phase exists within a voxel. This inhomogeneous voxel then becomes a source of signal contamination for the other voxels and is itself reconstructed with attenuated signal. Therefore, it is advantageous to develop other reconstruction methods that can yield well-localized SRFs for all voxels.

In another approach for calculating the decoding matrix coefficients, an optimization technique can be used to solve for the decoding matrix coefficients in one row of the decoding matrix. As an example, this optimization may be done to minimize the least-square-error between an ideal SRF and a calculated SRF for a voxel, $\tilde{\rho}_n$. It will be appreciated by those skilled in the art that other optimization functions may be used. For example, the $l_1$-norm could be minimized in a sparse domain. A least-squares minimization will have the following form:

$$\mathrm{argmin}\left\{ \sum_{xyz} \left( SRF_{ideal}(x, y, z) - \sum_{kl} F(\rho_n, \theta_k, t_l) e^{-i\omega(\theta_k, x, y, z) t_l} \right)^2 \right\}. \qquad (11)$$

If a good global minimum is found, the SRF from the resulting optimized reconstruction coefficients will be fairly localized and signal contaminations from other spatial locations will be minimized. Global minima are only found when the target (ideal) SRF is realizable, given the particular set of phase maps. Thus, it is important to choose the appropriate size, shape, and position of each target SRF, corresponding to each desired voxel.

Once all of the decoding matrix coefficients for all voxels in the reconstruction grid have been computed, Eqn. (3) can be used to reconstruct a magnetization density matrix of size N. An approach such as the one just described can be considered as an inverse-problem solution for the spatial-encoding technique provided by the present invention.

Having described the spatial-encoding and image reconstruction processes, a discussion of various configurations of the spatial-encoding elements and their incorporation into different devices is now provided.

Figure 1:
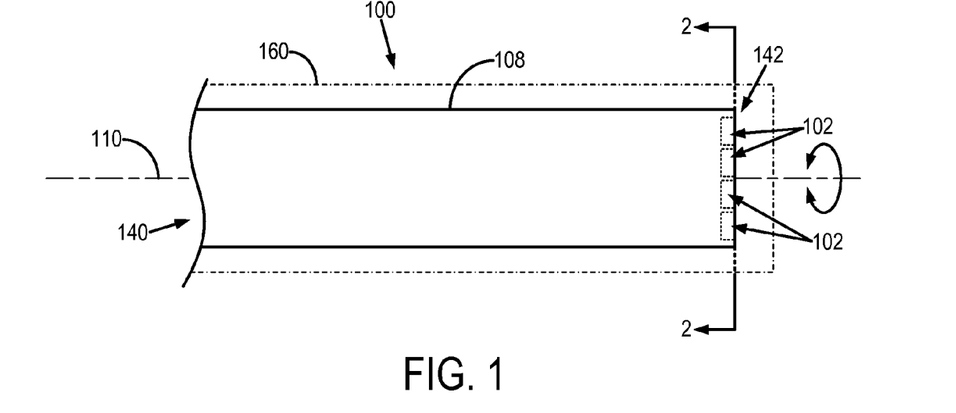
FIG. 1 is a plan view of an example of a device in accordance with some embodiments of the present invention.

With initial reference to FIG. 1, a device 100 for acquiring image data with magnetic resonance imaging ("MRI") is provided. By way of example, the device 100 may be a medical device, such as an interventional device or an endoscope. In addition, the device 100 may form a part of a nuclear magnetic resonance probe configured for oil well logging, or the device 100 may be configured for other possible magnetic resonance imaging or nuclear magnetic resonance applications. Generally, the device 100 includes multiple spatial-encoding elements 102 that are coupled to a support, such as a shaft 108 of the device 100. The spatial-encoding elements 102 are coupled to the shaft 108 of the device 100 such that the spatial-encoding elements 102 may be spaced in a fixed arrangement that allows the spatial-encoding elements 102 to move relative to one another. For example, the shaft 108 may be rotated about an axis of rotation, such as a longitudinal or roll axis 110. The shaft 108 extends from a proximal end 140 of the device 100 to a distal end 142 of the device 100 along the roll axis 110.

Figure 2:
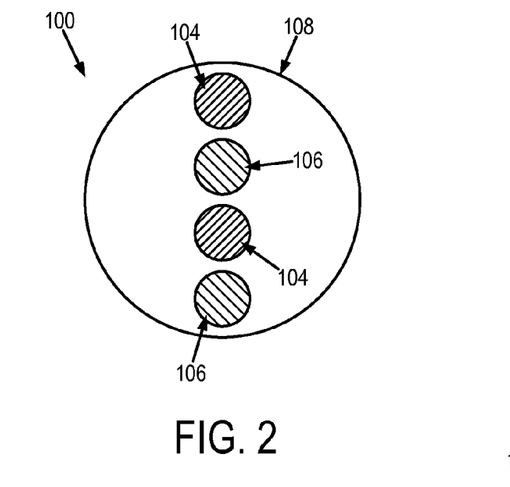
FIG. 2 is a cross-sectional view of the device of FIG. 1 viewed along line 2-2.
Figure 3:
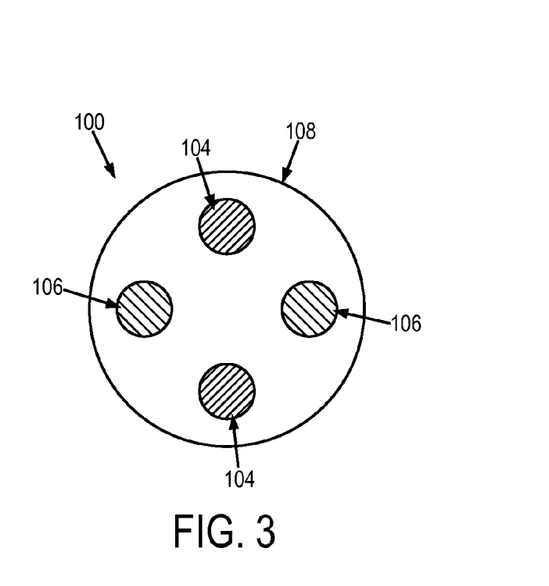
FIG. 3 is a cross-sectional view of another configuration of the device of FIG. 1 viewed along line 2-2.

The spatial encoding elements 102 may be arranged such that they are all collinear, as illustrated in FIG. 2, or they may be arranged such they are not all collinear with each other. An example of a configuration of the device 100 in which the spatial-encoding elements 102 are not all collinear with each other is illustrated in FIG. 3. In this arrangement, the spatial encoding elements 102 are arranged as the vertices of a square. It will be appreciated that the spatial encoding elements 102 can be arranged in any number of spatial arrangements not illustrated here, and such spatial arrangements may differ depending on the number of spatial encoding elements 102 that are used. For example, if six spatial encoding elements 102 are used, then it may be advantageous for the spatial encoding elements 102 to be arranged as the vertices of a hexagon. Preferably, the spatial-encoding elements 102 are coplanar; however, in some configurations the spatial-encoding elements may not be entirely coplanar. As shown in FIGS. 2 and 3, the spatial-encoding elements 102 include both diamagnetic elements 104 and paramagnetic elements 106. The spatial-encoding elements 102 may be shaped as spheres, spherical frustums, cones, conical frustums, circular discs, or other geometries. Examples of paramagnetic materials include titanium; however, it will be appreciated by those skilled in the art that other suitable paramagnetic materials may also be used. Examples of diamagnetic materials include graphite; however, it will be appreciated by those skilled in the art that other suitable diamagnetic materials may also be used, such as bismuth.

Figure 5:
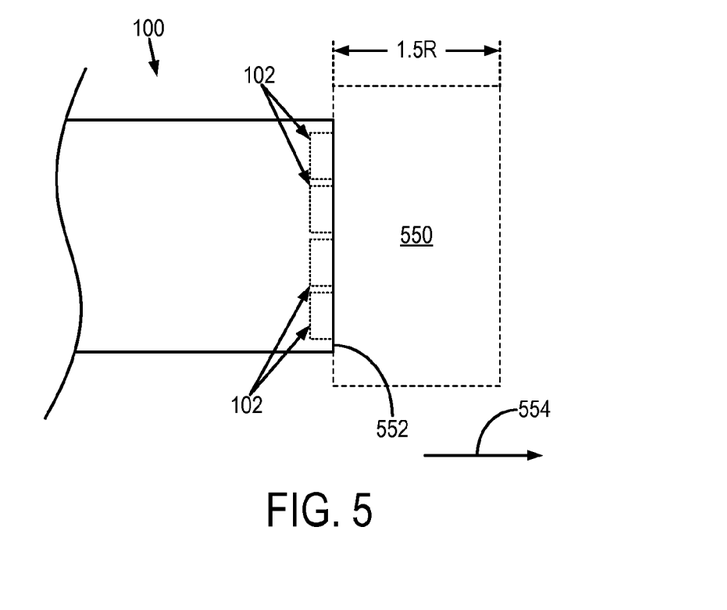
FIG. 5 is a pictorial representation of an example of a sensitive volume adjacent the device of FIG. 1.

Intravoxel phase dispersions may be caused by inhomogeneous magnetic fields generated by the spatial-encoding elements 102 in the out-of-plane direction. The magnetic field perturbations generated by the spatial-encoding elements 102 vary significantly in the out-of-plane direction, which can result in signal loss in voxels. Thus, it may be advantageous to define a sensitive region of the device 100. One example of the sensitive region of the device 100 is illustrated in FIG. 5. In this configuration, the sensitive region is defined for spatial-encoding elements 102 having a circular cross-section. The sensitive region 550 of the device 100 extends from the surface 552 of the device 100 to a distance of 1.5 R along an out-of-plane direction 554 that is normal to the surface 552 of the device 100, and where R is the radius of each spatial-encoding element 102. Beyond a distance of 1.5 R, there are no significant off-resonance magnetic field perturbations, which create the basis for spatial encoding, for different roll-angle steps of the device. Intravoxel dephasing may be addressed by considering three-dimensional magnetic field perturbations of the spatial-encoding elements 102 and by building encoding and decoding matrices for a three-dimensional reconstruction grid with voxel sizes smaller than 1.5 R in the out-of-plane direction 554.

As a practical matter, when the spatial-encoding elements 102 are arranged such that there is an inherent symmetry of the magnetic field perturbations produced by the spatial-encoding elements with respect to the center of the arrangement, images reconstructed using such a device may include image artifacts that manifest as replication of magnetization densities. To mitigate these artifacts, the spatial-encoding elements may be arranged such that there is a disconnect in the inherent symmetry of the magnetic field perturbations generated by the spatial-encoding elements. One example of such an arrangement is the purely collinear arrangement illustrated in FIG. 2; however, it will be appreciated by those skilled in the art that other arrangements are possible.

Optionally, the device 100 may be surrounded by a bio-compatible layer 160 so that the magnetic materials, such as the spatial-encoding elements 102, do not come into direct contact with blood and tissue. In addition, the bio-compatible layer 160 may be configured to provide a gap between the spatial-encoding elements 102 and the exterior of the device 100 such that the local magnetic fields in the volume-of-interest are less steep than they would be without the gap.

By way of example, when the spatial-encoding elements 102 are arranged as illustrated in FIG. 3 and are placed in an external magnetic field, B, they will produce magnetic fields 112, such as those illustrated in FIG. 4. In particular, the magnetic fields 112 emanating from the paramagnetic elements 106 will be substantially aligned with the external magnetic field, B, whereas magnetic fields 112 emanating from the diamagnetic elements 104 will be substantially aligned opposite the external magnetic field.

With the spatial-encoding elements 102 arranged as illustrated in FIGS. 3 and 4, the magnetic fields 112 emanating from each of spatial-encoding elements 102 will be spatially non-homogeneous. The resulting magnetic field disturbances produced by the spatial-encoding elements 102 will move around as the device 100 is rotated about the rotation axis 110. Operating the device 100 in this manner provides a means for spatially encoding signals originating from spins in a volume-of-interest adjacent the device 100. However, to reconstruct an image from signals spatially encoded in this manner requires knowledge about the orientation of the device 100 with respect to the external magnetic field (such as the main magnetic field, $B_0$, of an MRI system), as will be described below in detail.

Figure 6A:
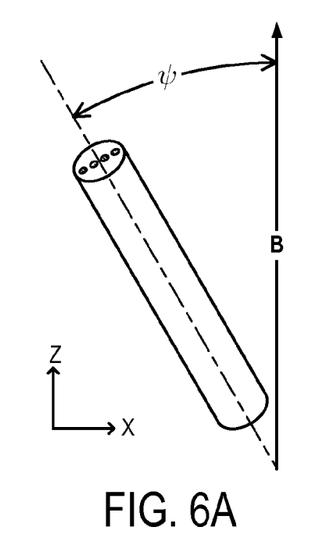
FIGS. 6A, 6B, and 6C illustrate a yaw angle, pitch angle, and roll angle of a device with respect to an external magnetic field, B.
Figure 6B:
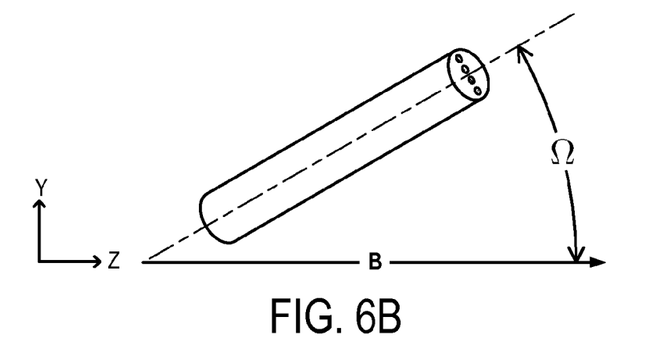
Figure 6C:
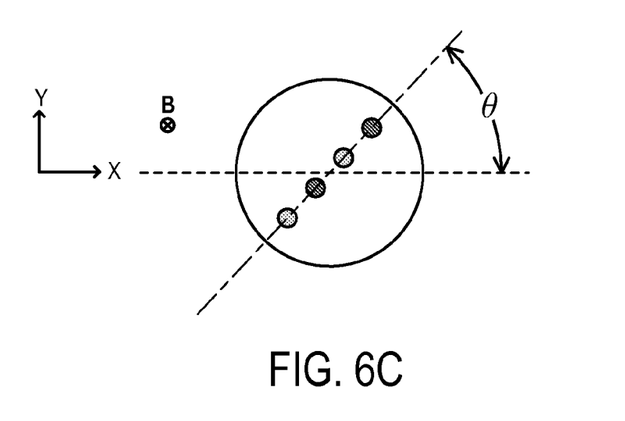

Referring now to FIGS. 6A-6C, the orientation of a device with respect to an external magnetic field, B, can be defined using a yaw, pitch, and roll angle. The yaw of a device 100 relative to an external magnetic field B aligned along the z-axis is illustrated in FIG. 6A. The yaw is measured by a yaw angle, ψ, which is a measure of rotation about the y-axis in the x-z plane. The pitch of a device 100 relative to an external magnetic field B aligned along the z-axis is illustrated in FIG. 6B. The pitch is measured by a pitch angle, Ω, which is a measure of rotation about the x-axis in the y-z plane. The roll of a device 100 relative to an external magnetic field B aligned along the z-axis is illustrated in FIG. 6C. The roll is measured by a roll angle, θ, which is a measure of rotation about the z-axis in the x-y plane.

Figures 7A, 7B:
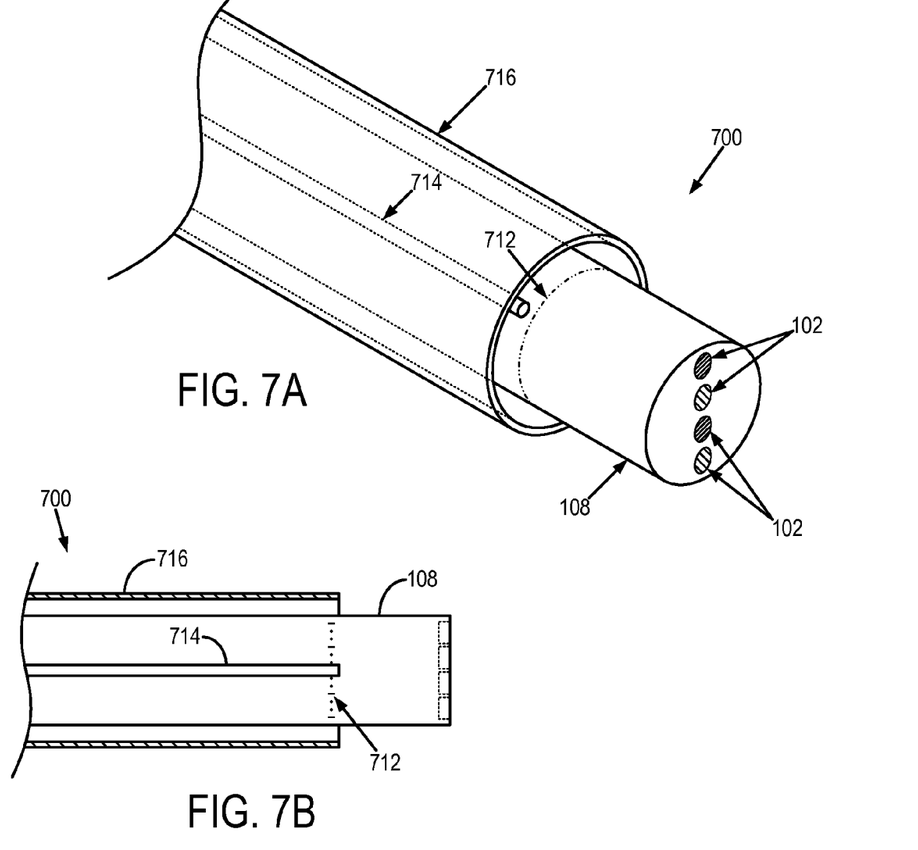
FIG. 7A is a perspective view of an example of a device having optical encoding means for identifying an orientation of the device in accordance with some embodiments of the present invention.
FIG. 7B is a partial cross-section view of the device of FIG. 7A.

To measure the roll angle of the device 100, the device 100 may be configured to incorporate a rotation tracking system, as illustrated in FIGS. 7A and 7B. An example of a rotation tracking system includes optical encoding of marks 712 that are arranged on the shaft 108 of the device 700. For example, the marks 712 may be markings that are etched into the surface of the shaft 108. The marks 712 may be optically read using an optical fiber 714. A sheath 716 may be provided to support the optical fiber 714 and to keep the position of the optical fiber 714 fixed while the shaft 108 is free to rotate within the sheath 716. The optical signal carried by the optical fiber 714 conveys information about the roll angle at which the shaft 108 is oriented, as encoded by the marks 712, and this roll angle information is used during image reconstruction, as will be described below in detail.

Figure 7C:
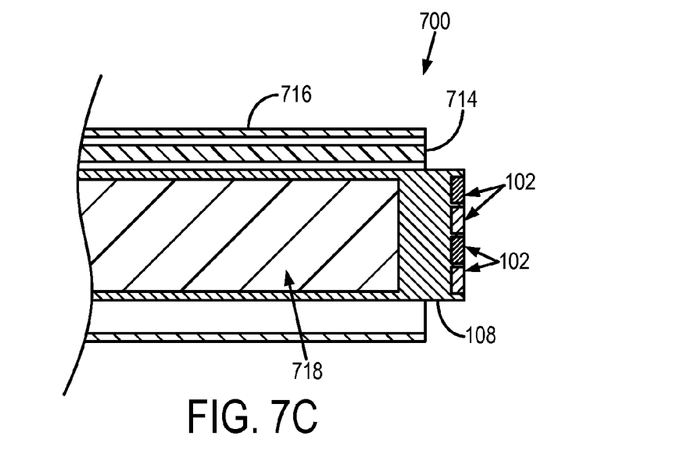
FIG. 7C is a cross-section view of another configuration of the device of FIG. 7A, in which a tracking system is incorporated into the device 7A.

The yaw and pitch of the device can be measured in a number of different ways. By way of example, and referring to FIG. 7C, when the device 700 is positioned in the main magnetic field, $B_0$, of an MRI system, the device 700 may be configured to include a tracking system 718 capable of tracking and measuring the yaw and pitch of the device 700. In general, such a tracking system 718 may be incorporated into the interior of the shaft 108 of the device 700, and may include tracking elements having different magnetic susceptibilities. For example, one or more tracking elements may be composed of a paramagnetic material, and one or more tracking elements may be composed of a diamagnetic material. These tracking elements can be operated into an arrangement such that when they are positioned in the main magnetic field, $B_0$, of an MRI system, they produce a measureable local magnetic field. However, it is noted that the tracking system 718 can be designed such that the local magnetic field generated by the tracking system 718 do not interfere or affect the field perturbations produced by the spatial-encoding elements 102. When the tracking elements in the tracking system 718 are arranged such that a measureable local magnetic field is produced, the device 700 can be imaged. The measurable local magnetic field will affect the images of the device and from this effect, the orientation of the device 700 can be determined. More particularly, the yaw and pitch angles of the device 700 can be determined from these images. Examples of tracking systems of this nature is described in co-pending PCT Application No. CA2010/002041, which is herein incorporated by reference in its entirety.

Figure 8A:
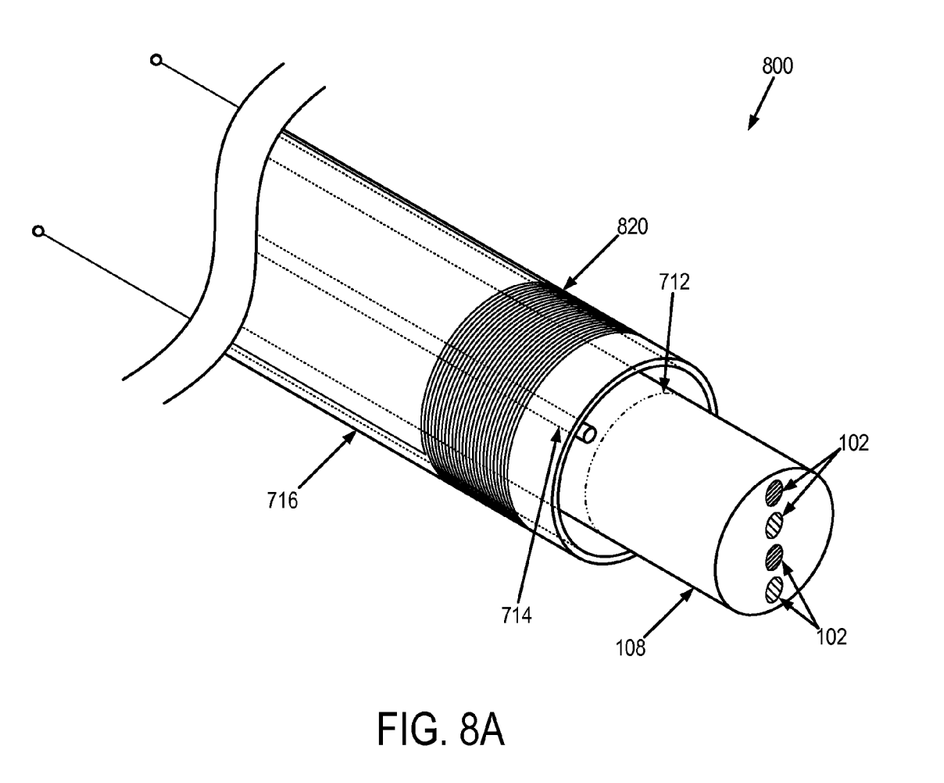
FIG. 8A is a perspective view of an example of a device having a radiofrequency receiver coil for receiving magnetic resonance signals and optical encoding means for identifying an orientation of the device in accordance with some embodiments of the present invention.
Figure 8B:
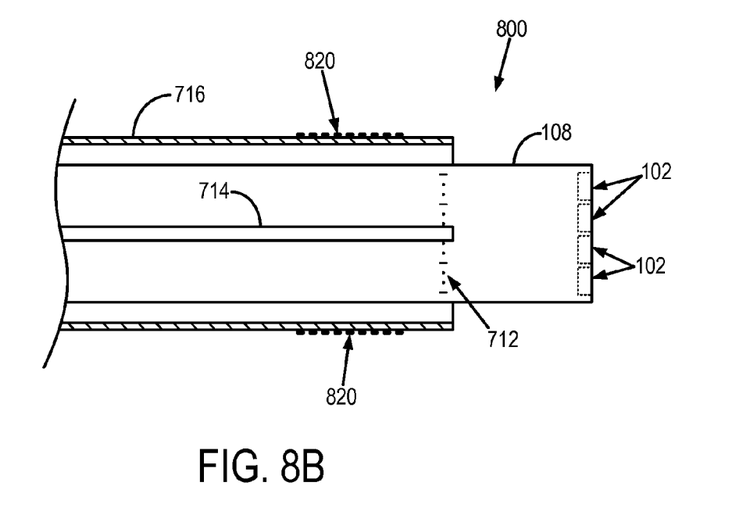
FIG. 8B is a partial cross-section view of the device of FIG. 8A.

In other configurations of the device, such as the one illustrated in FIG. 8, a receiver coil 820 may be coupled to the device 800. Such a configuration is advantageous for applications in which high spatial and temporal resolution are desired, such as intravascular imaging applications. In intravascular imaging applications it is important that adequate signal-to-noise ratio ("SNR") be achieved; thus, to limit the volume of material that contributes noise to the acquired signals, the receiver coil 820 may be coupled to the sheath 716 of the device 800. The receiver coil 820 may include, for example, a conductive wire wound around the sheath 716. In such a configuration, the windings of the receiver coil 820 can inductively couple to the tissue, thereby enabling direct signal reception. In the alternative, the windings can be designed to inductively couple to the shaft of the device 716, as described, for example, by K. Anderson, et al., in "Active Visualization of MR-Compatible Guidewires," *Proc. Intl. Soc. Mag. Reson. Med.* 17, 2009; 2569. In the latter configuration, the shaft 716 of the device 800 acts as both a spatial-encoding mechanism and a signal reception mechanism. The use of small signal reception structures such as the receiver coil 820 provides the added advantage of restricting the volume from which signal is acquired, which acts as a regularization of the image reconstruction method that is described below in detail. Although the amplitude of signals detected by the receiver coil 820 will decrease with distance from the device 800, the achievable image pixel size increases with distance from the device 800; thus, the larger pixel size offsets the loss in signal amplitude and provides for an increase in the total measurable signal amplitude for pixels located farther from the device 800.

As described above, the disclosed spatial-encoding elements 102 produce magnetic field perturbations when placed in an external magnetic field. These magnetic field perturbations alter the resonance frequency of spins that exists at spatial locations affected by the magnetic field perturbations. By way of example, the spatial-encoding elements 102 produce magnetic field perturbations that result in resonance frequency offsets between −2000 Hz and +2000 Hz for an external magnetic field with a strength of 1.5 T. Therefore, a free-induction decay ("FID") occurring in a region affected by the magnetic field perturbations will contains resonance frequencies in the range defined by these resonance frequency offsets. By rotating the device 100 about its roll axis 110, the frequency content of those FIDs that occur in a volume-of-interest adjacent the device 100 will remain the same. However, spins that do not experience the magnetic field perturbations generated by the spatial-encoding elements 102 will precess at their Larmor frequency, $\omega_0 = \gamma B_0$, and their phases will contain no spatial information. Thus, exciting these spins will degrade the accuracy of the reconstructed image. Off-resonance excitation can be used to excite only those spins that are experiencing magnetic field perturbations due to the device 100 in order to restrict the region from which signals are acquired. As mentioned earlier, another approach to restricting the signal region is to incorporate RF receiver coils for signal acquisitions into the device 100.

To perform off-resonance excitation, a radio frequency ("RF") pulse having frequency content that matches the frequency offsets noted above is used to excite the desired spins. This RF excitation pulse may be, for example, a composite RF pulse with a binomial distribution designed using the Shinnar-LeRoux algorithm. Spins that are precessing with different Larmor frequencies will experience different flip angles due to the excitation profile of these off-resonance RF excitation pulses, which are frequency dependent. It is contemplated that this excitation profile will lead to encoding matrix rows that are modulated by the flip angle profile of the RF excitation pulse, which will improve the reconstruction process.

In conventional slice-selective RF excitation, the RF excitation profile will be similar to the Fourier transform of the RF pulse in presence of a slice-selective gradient field. With this new technique, the magnetic field perturbations will assume the functions of the slice-selective gradient; however, because of the nonlinear nature of these magnetic field perturbations, the RF excitation profile will not resemble the Fourier transform of the RF excitation pulse. Thus, the off-resonance RF excitation pulse described above will excite only those spins precessing at Larmor frequencies within the bandwidth of the proposed off-resonance RF excitation pulse.

As described above, the magnetic field perturbations generated by the spatial-encoding elements 102 are dependent on the orientation of the device 100 with respect to the externally applied magnetic field. Therefore, it is desirable to provide a method for effectively measuring the orientation of the device 100 with respect to the external magnetic field. The measured yaw, pitch, and rotation angles can be used when calculating the encoding or decoding matrices to correct for any deviation of the device 100 from the external magnetic field. It is noted, however, that image reconstruction will not be significantly affected when the device 100 deviates from its alignment with the external magnetic field by a yaw angle, pitch angle, or both of plus or minus fifteen degrees. However, if the device 100 undergoes significant motion (e.g., inside coronary arteries), it may be necessary to measure the angle between the device 100 and the external magnetic field.

As the device 100 rotates around its roll axis 110, a positive image contrast in the plane perpendicular to the roll axis 110 will be changed as a result of the rotation of the magnetic field perturbations with the device 100. In addition to using a rotation tracking system incorporated into the device 100 as discussed above, the roll angle of the device 100 can be determined from two projection images of the device 100 that are acquired with the device rotated to two different roll angles, $\theta_1$ and $\theta_2$. It is contemplated that there is a bijective relationship between the roll angle, $\theta$, of the device 100 and the length of the magnetic field perturbations at this angle. The length of the magnetic field perturbations can be calculated from the size of a hyperintense region present in a projection image of the device 100. The roll angle, $\theta$, of the device can be determined from these two projection images as follows:

$$\theta_2 = \arccos\left(\frac{b}{a}\right); \tag{12}$$

where a is the length of the magnetic field perturbations at the first roll angle and b is the length of the magnetic field perturbations at the second roll angle. It is possible to generalize this concept to measure both the yaw and pitch angles of the device 100 as well.

Without loss of generality and by way of example, assume that the device 100 is initially oriented along the z-axis and is parallel to the external magnetic field, B, and that the device is rotated to a roll angle of $\theta_1$. If the device 100 is moved, the following equation can be used to establish a relationship between the initial position of the device 100 and the new position of the device 100 using rotational angles:

$$\begin{bmatrix} x_1 \\ y_1 \\ z_1 \end{bmatrix} = R_x(\theta_1)R_y(\Omega)R_z(\psi)\begin{bmatrix} 0 \\ 0 \\ a \end{bmatrix}. \tag{13}$$

However, the initial roll angle, $\theta_1$, is unknown and Eqn. (13) cannot be solved for the yaw and the pitch angles, $\psi$ and $\Omega$, respectively. To resolve the roll angle, the 100 device may be rotate by a known angle, such as ninety degrees, about the roll axis and the new position of the 100 device may be computed.

$$\begin{bmatrix} x_2 \\ y_2 \\ z_2 \end{bmatrix} = R_x(\theta_1 + 90°)R_y(\Omega)R_z(\psi)\begin{bmatrix} 0 \\ 0 \\ a \end{bmatrix}; \tag{14}$$

By combining Eqn. (13) and Eqn. (14), the yaw, pitch, and roll angles can be computed. A total of six measurements $(x_1, y_1, z_1, x_2, y_2, z_2)$ are required to establish the following sets of linear equations.

$$R_x(\theta) = \begin{bmatrix} 1 & 0 & 0 \\ 0 & \cos\theta & -\sin\theta \\ 0 & \sin\theta & \cos\theta \end{bmatrix}; \tag{15}$$

$$R_y(\Omega) = \begin{bmatrix} \cos\Omega & 0 & \sin\Omega \\ 0 & 1 & 0 \\ -\sin\Omega & 0 & \cos\Omega \end{bmatrix}; \tag{16}$$

$$R_z(\psi) = \begin{bmatrix} \cos\psi & -\sin\psi & 0 \\ \sin\psi & \cos\psi & 0 \\ 0 & 0 & 1 \end{bmatrix}. \tag{17}$$

The angle measurement technique may be used to locate the spatial position and orientation of device 100 under MRI guidance; however such a technique may suffer from its long acquisition time. For example, the long acquisition time may be unacceptable in some applications, such as positioning an interventional device in coronary arteries where there is significant motion in a short period of time. To address this issue, one-dimensional positive contrast projections can be obtained along each of three principal axes and used both to estimate the coordinates of the device and to measure the length of the hyperintense region adjacent the device.

Figure 9A:
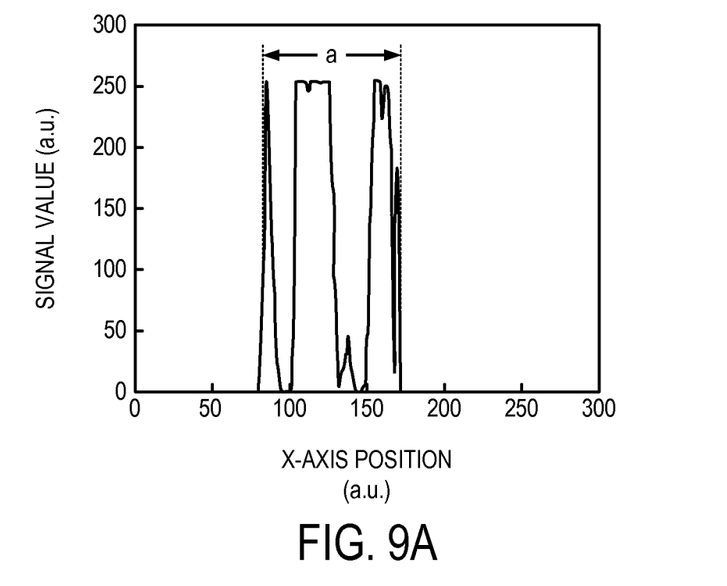
FIG. 9A is an example of a measured one-dimensional projection of a device such as the one in FIG. 1 along an x-axis, in which the device is oriented at a first roll angle.
Figure 9B:
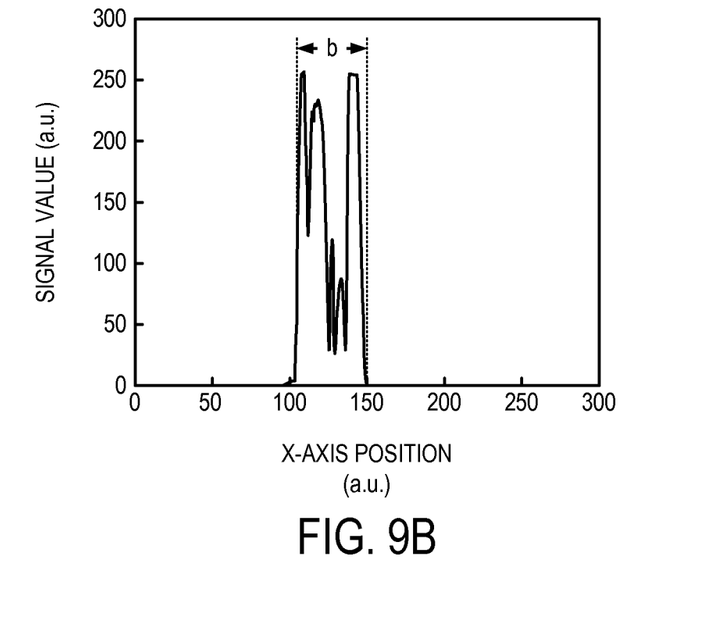
FIG. 9B is an example of a measured one-dimensional projection of a device such as the one in FIG. 1 along an x-axis, in which the device is oriented at a second roll angle that is different than the one corresponding to FIG. 9A.

One-dimensional projections are commonly used for positioning devices under MRI guidance, and can significantly reduce the acquisition time needed for localization. By way of example, FIGS. 9A and 9B illustrate examples of measured one-dimensional projections of the device 100. FIG. 9A illustrates an example in which the device 100 is oriented at a roll angle of zero degrees with respect to the external magnetic field, and FIG. 9B illustrates an example in which the device 100 is oriented at a roll angle of forty-five degrees with respect to the external magnetic field. The width of the hyperintense region adjacent the device 100 can be readily measured from these one-dimensional projections. For example, the width of this region at the first roll angle, $\theta_1 = 0$ degrees, is a, and the width of this region at the second roll angle, $\theta_2 = 45$ degrees, is b.

Figure 10:
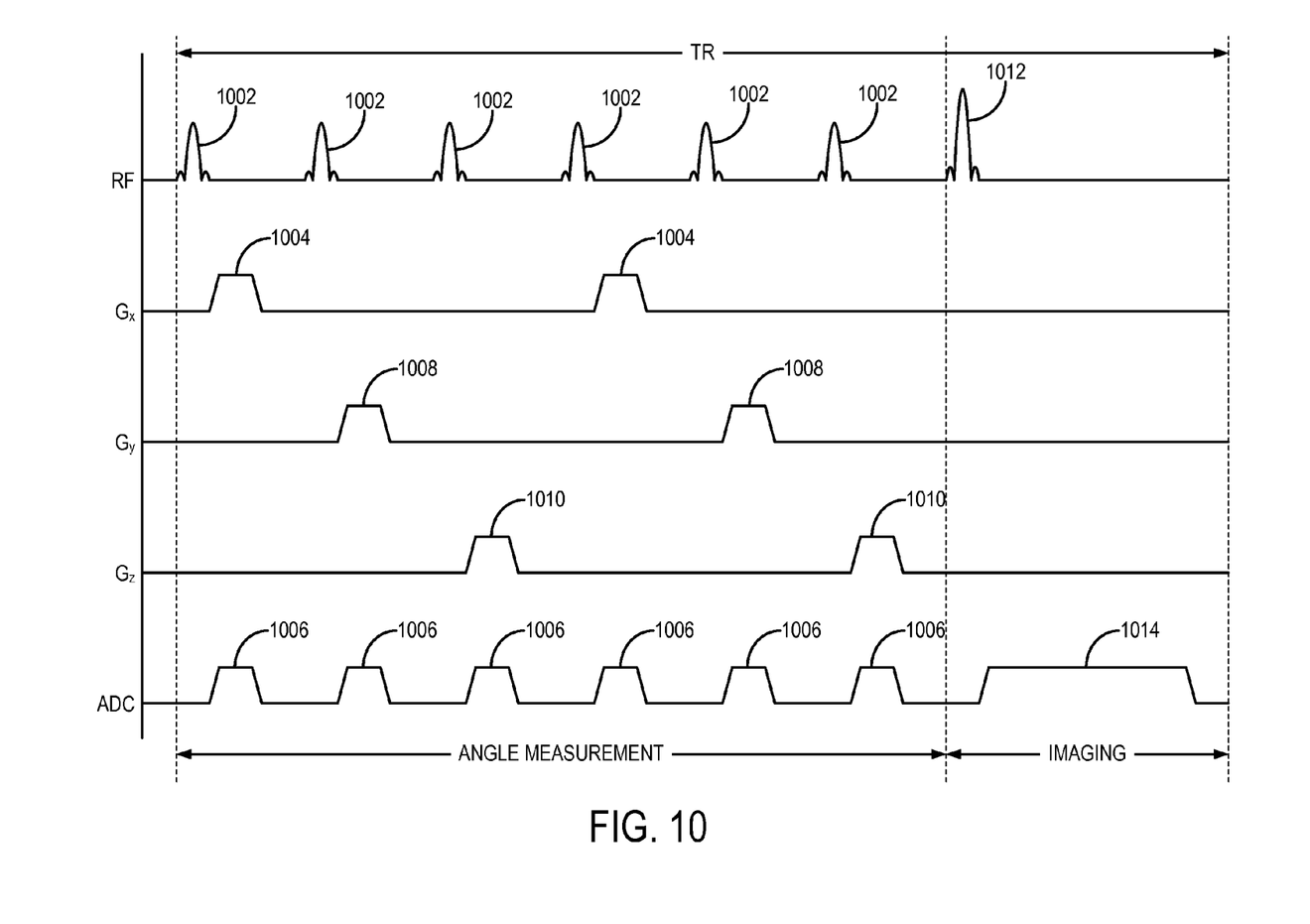
FIG. 10 is a pulse sequence diagram of an example of a pulse sequence that may be used to measure the orientation of a device such as the one in FIG. 1.

An example of a pulse sequence that may be used to obtain one-dimensional projections of the device 100 is illustrated in FIG. 10, to which reference is now made. The pulse sequence generally includes the application of an RF excitation pulse followed by a dephasing gradient along the axis of interest. Readout of the resulting FID then starts at an echo time ("TE") after the dephasing gradient. Thus, for example, the pulse sequence may include the application of an RF excitation pulse 1002 followed by the application of a dephasing gradient 1004 along the x-axis such that an FID is produced and sampled during a readout window 1006. This sampled FID will provide a one-dimensional projection of the device 100 along the x-axis. The pulse sequence may further include the application of an RF excitation pulse 1002 followed by the application of a dephasing gradient 1008 along the y-axis such that an FID is produced and sampled during a readout window 1006. This sampled FID will provide a one-dimensional projection of the device 100 along the y-axis. The pulse sequence may still further include the application of an RF excitation pulse 1002 followed by the application of a dephasing gradient 1010 along the z-axis such that an FID is produced and sampled during a readout window 1006. This FID will provide a one-dimensional projection of the device 100 along the z-axis. The foregoing RF excitation pulses 1002 and dephasing gradients 1004, 1008, 1010 may be repeated a second time after the device 100 has be moved to a different position such that a different set of one-dimensional projections are acquired. After the angle measurement portion of the pulse sequence has concluded, the imaging portion begins. Because spatial-encoding is provided by the device, the imaging portion of the pulse sequence does not require the application of magnetic field gradients using the MRI system. Thus, the imaging portion of the pulse sequence generally includes only an RF excitation pulse 1012.

Using the foregoing pulse sequence, the angle of the device 100 can be measured with respect to each principal axis before each data acquisition step. As described above, knowing the orientation of the device with respect to external magnetic field can be advantageous to improve the accuracy of the image reconstruction techniques described herein. With this proposed technique, the angle of the device 100, and therefore the angle of the spatial-encoding elements 102, can be measured respect to the external magnetic field before each angle-step of the device 100 in order to perform corrections to the decoding matrix, F. It is noted that the roll angle may be more precisely measured using a rotation tracking system, such as the optical system described above. For practical reasons, it is contemplated that using such a system instead of measuring the roll angle with an MRI system will be preferable.

Figure 11:
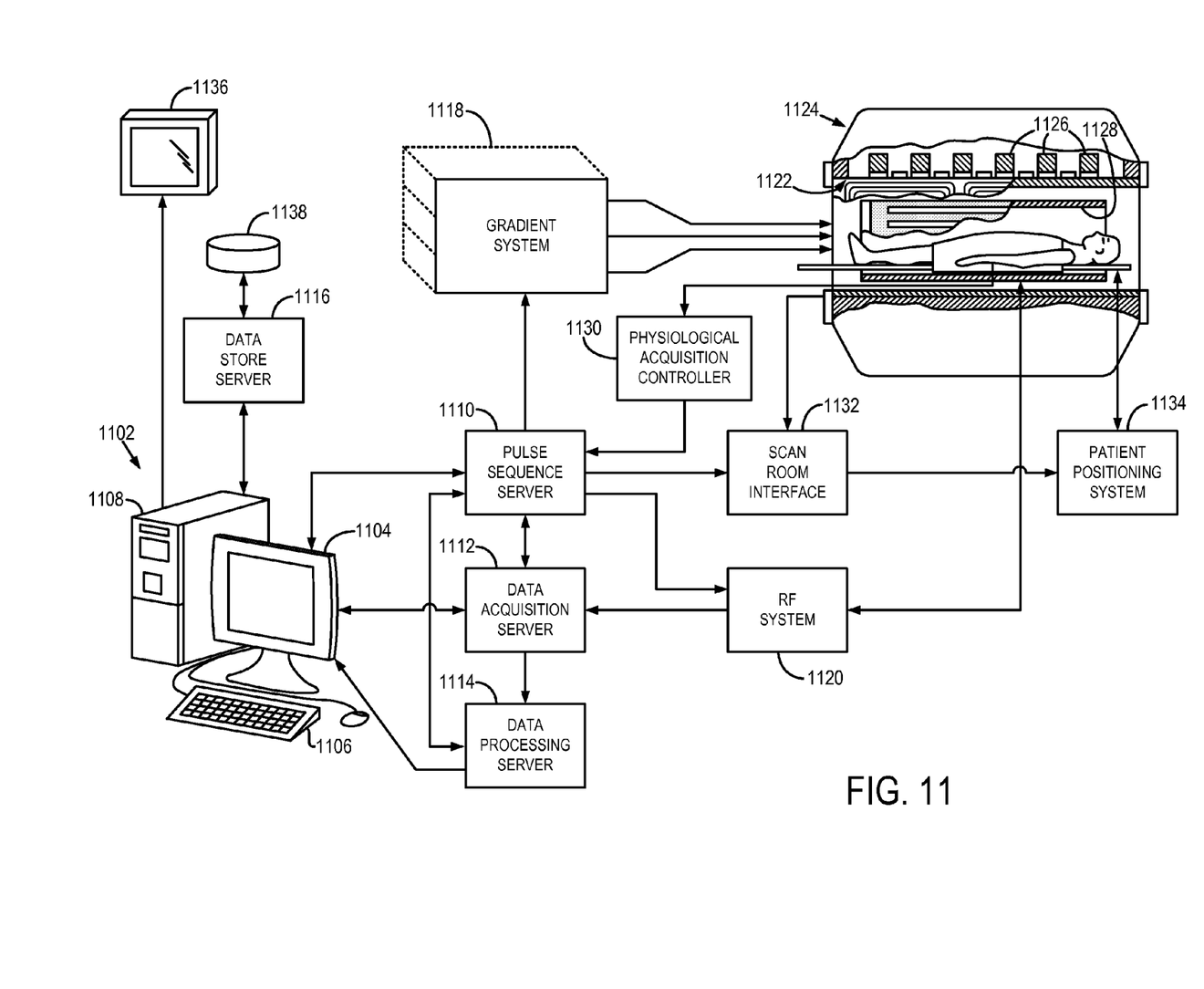
FIG. 11 is a block diagram of an example of a magnetic resonance imaging ("MRI") system for imaging with the device of the present invention.

Referring particularly now to FIG. 11, an example of an MRI system 1100 for use with the provided device is illustrated. The MRI system 1100 includes a workstation 1102 having a display 1104 and a keyboard 1106. The workstation 1102 includes a processor 1108, such as a commercially available programmable machine running a commercially available operating system. The workstation 1102 provides the operator interface that enables scan prescriptions to be entered into the MRI system 1100. The workstation 1102 is coupled to four servers: a pulse sequence server 1110; a data acquisition server 1112; a data processing server 1114, and a data store server 1116. The workstation 1102 and each server 1110, 1112, 1114 and 1116 are connected to communicate with each other.

The pulse sequence server 1110 functions in response to instructions downloaded from the workstation 1102 to operate a gradient system 1118 and a radiofrequency ("RF") system 1120. Gradient waveforms necessary to perform the prescribed scan are produced and applied to the gradient system 1118, which excites gradient coils in an assembly 1122 to produce the magnetic field gradients $G_x$, $G_y$, and $G_z$ used for position encoding MR signals. The gradient coil assembly 1122 forms part of a magnet assembly 1124 that includes a polarizing magnet 1126 and a whole-body RF coil 1128.

RF excitation waveforms are applied to the RF coil 1128, or a separate local coil (not shown in FIG. 11), by the RF system 1120 to perform the prescribed magnetic resonance pulse sequence. Responsive MR signals detected by the RF coil 1128, or a separate local coil (not shown in FIG. 11), are received by the RF system 1120, amplified, demodulated, filtered, and digitized under direction of commands produced by the pulse sequence server 1110. The RF system 1120 includes an RF transmitter for producing a wide variety of RF pulses used in MR pulse sequences. The RF transmitter is responsive to the scan prescription and direction from the pulse sequence server 1110 to produce RF pulses of the desired frequency, phase, and pulse amplitude waveform. The generated RF pulses may be applied to the whole body RF coil 1128 or to one or more local coils or coil arrays (not shown in FIG. 11).

The RF system 1120 also includes one or more RF receiver channels. Each RF receiver channel includes an RF amplifier that amplifies the MR signal received by the coil 1128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (18);$$

and the phase of the received MR signal may also be determined:

$$\phi = \tan^{-1}\left(\frac{Q}{I}\right). \qquad (19)$$

The pulse sequence server 1110 also optionally receives patient data from a physiological acquisition controller 1130. The controller 1130 receives signals from a number of different sensors connected to the patient, such as electrocardiograph ("ECG") signals from electrodes, or respiratory signals from a bellows or other respiratory monitoring device. Such signals are typically used by the pulse sequence server 1110 to synchronize, or "gate," the performance of the scan with the subject's heart beat or respiration.

The pulse sequence server 1110 also connects to a scan room interface circuit 1132 that receives signals from various sensors associated with the condition of the patient and the magnet system. It is also through the scan room interface circuit 1132 that a patient positioning system 1134 receives commands to move the patient to desired positions during the scan.

The digitized MR signal samples produced by the RF system 1120 are received by the data acquisition server 1112. The data acquisition server 1112 operates in response to instructions downloaded from the workstation 1102 to receive the real-time MR data and provide buffer storage, such that no data is lost by data overrun. In some scans, the data acquisition server 1112 does little more than pass the acquired MR data to the data processor server 1114. However, in scans that require information derived from acquired MR data to control the further performance of the scan, the data acquisition server 1112 is programmed to produce such information and convey it to the pulse sequence server 1110. For example, during prescans, MR data is acquired and used to calibrate the pulse sequence performed by the pulse sequence server 1110. Also, navigator signals may be acquired during a scan and used to adjust the operating parameters of the RF system 1120 or the gradient system 1118, or to control the view order in which k-space is sampled. The data acquisition server 1112 may also be employed to process MR signals used to detect the arrival of contrast agent in a magnetic resonance angiography ("MRA") scan. In all these examples, the data acquisition server 1112 acquires MR data and processes it in real-time to produce information that is used to control the scan.

The data processing server 1114 receives MR data from the data acquisition server 1112 and processes it in accordance with instructions downloaded from the workstation 1102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 1114 are conveyed back to the workstation 1102 where they are stored. Real-time images are stored in a data base memory cache (not shown in FIG. 11), from which they may be output to operator display 1112 or a display 1136 that is located near the magnet assembly 1124 for use by attending physicians. Batch mode images or selected real time images are stored in a host database on disc storage 1138. When such images have been reconstructed and transferred to storage, the data processing server 1114 notifies the data store server 1116 on the workstation 1102. The workstation 1102 may be used by an operator to archive the images, produce films, or send the images via a network to other facilities.

Figure 12:
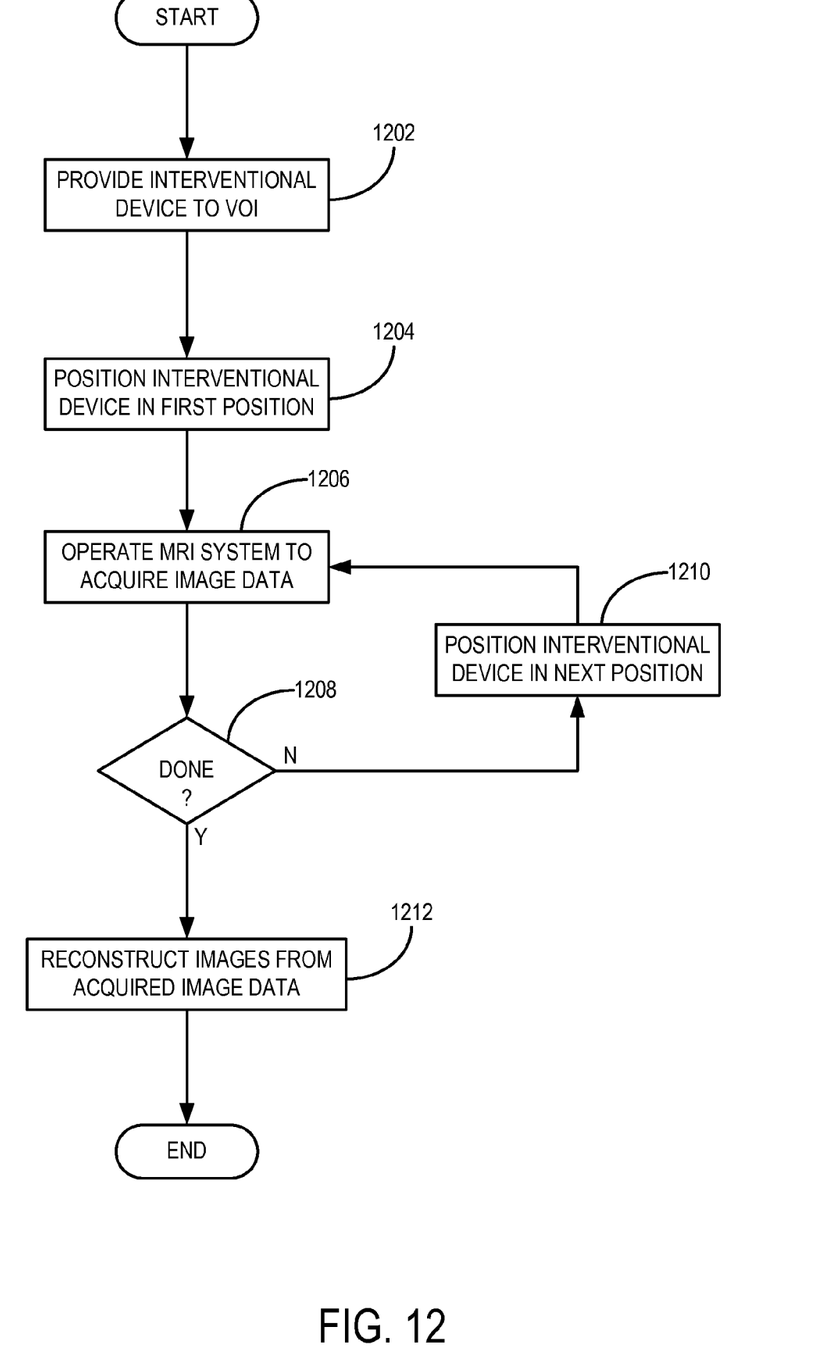
FIG. 12 is a flowchart setting forth the steps of an example of a method for imaging a volume-of-interest during an imaging application, such as an interventional or endoscopic procedure, using the provided device and an MRI system.

Having described the general structure of the provided device, and various examples of configurations thereof, a description of a general operation of the device is now provided. Referring now to FIG. 12, a flowchart setting forth the steps of an example of a method for imaging a volume-of-interest during an imaging application, such as an interventional or endoscopic procedure, using the provided device and an MRI system is illustrated. First, the device is provided to a volume-of-interest ("VOI") that is to be imaged, as indicated at step 1202. For example, the device is provided to a VOI in a patient undergoing an interventional or endoscopic procedure in the presence of the main magnetic field, $B_0$, of an MRI system. In the alternative, the device may be provided to a bore hole for NMR oil well logging applications. The device is then operated to be positioned in a first position, as indicated at step 1204. In this first position, the device produces a first spatial-encoding magnetic field. For example, the device may be rotated about an axis of rotation into a first rotational orientation. The MRI system is then operated to acquire image data from the VOI, as indicated at step 1206. Given the proximity of the VOI to the device, the acquired image data is spatially-encoded by the spatial-encoding magnetic fields produced by the device.

Advantageously, the device is free to move in conjunction with physiological motion, such as respiration, cardiac rhythm, and pulsatile flow. As a result, the spatial-encoding magnetic fields move along with the device and in conjunction with physiological motions. Because of this result, the device effectively images the VOI in a frame of reference that moves along with present physiological motions. By imaging in this local frame of reference, motion-related errors in the acquired image data are mitigated, and substantially motion-artifact free images can be reconstructed from the image data.

A determination is made at decision block 1208 as to whether the desired amount of image data has been acquired. If not, then the device is positioned in a different position, as indicated at step 1210, and the MRI system operated again to acquire more image data. By way of example, a new roll, pitch, and yaw angle of the device may then be calculated in this new position. In each different position, the device provides a different spatial encoding to the acquired image data. By acquiring a plurality of image data sets, each with a different spatial encoding, one of the image reconstruction techniques presented above can be solved. Thus, after the desired amount of image data has been acquired, images of the VOI are reconstructed, as indicated at step 1212. By way of example, reconstruction coefficients based on the measured roll, pitch, and yaw of the device may be calculated and used in the reconstruction process. It is noted that the image data acquisition and image reconstruction processes can take place in real-time, so as to provide visual feedback to a user, such as a medical practitioner performing an interventional or endoscopic procedure. For real-time display applications, pre-computed reconstruction coefficients can be used and matched to the measured roll, pitch, and yaw of the device using a look-up table.

The present invention has been described in terms of one or more preferred embodiments, and it should be appreciated that many equivalents, alternatives, variations, and modifications, aside from those expressly stated, are possible and within the scope of the invention.

The invention claimed is:

1. A device for generating spatial-encoding magnetic fields when positioned in an external magnetic field, the device comprising:
   a plurality of spatial-encoding elements configured to produce a spatial-encoding magnetic field in the presence of an external magnetic field, the plurality of spatial-encoding elements comprising:
     at least one paramagnetic spatial-encoding element;
     at least one diamagnetic spatial-encoding element; and
   a rotatable support coupled to the plurality of spatial-encoding elements and configured to space the plurality of spatial-encoding elements in a fixed spatial arrangement and to rotate the spatial-encoding elements about a rotation axis of the support in order to produce a plurality of different spatial-encoding magnetic fields in the presence of the external magnetic field.

2. The device as recited in claim 1 in which at least one of the plurality of spatial-encoding elements is shaped as at least one of a sphere, a spherical frustum, a cone, a conical frustum, and a circular disc.

3. The device as recited in claim 1 further comprising a radio frequency receiver coil coupled to the support and configured to receive nuclear magnetic resonance signals from a volume-of-interest adjacent the support.

4. The device as recited in claim 1 in which the rotatable support is cylindrically shaped and extends from a distal end to a proximal end along a longitudinal axis, and in which the rotation axis is the longitudinal axis of the support.

5. The device as recited in claim 4 in which a surface of the rotatable support includes marks that indicate a rotational orientation of the rotatable support with respect to rotation about the longitudinal axis.

6. The device as recited in claim 5 further comprising an optical device coupled to the rotatable support and configured to identify the rotational orientation of the rotatable support by analyzing the marks.

7. The device as recited in claim 6 further comprising an optical fiber that couples the optical device to the rotatable support.

8. The device as recited in claim 7 further comprising a sheath disposed about the rotatable support and configured to hold the optical fiber in a fixed position with respect to the rotatable support.

9. The device as recited in claim 8 further comprising a radio frequency receiver coil coupled to the sheath and configured to receive nuclear magnetic resonance signals from a volume-of-interest adjacent the sheath.

10. The device as recited in claim 1 further comprising a tracking system coupled to the rotatable support, the tracking system being configured to measure a yaw angle and a pitch angle with respect to the external magnetic field.

11. The device as recited in claim 10 in which the tracking system includes:
- a first tracking member having a first magnetic susceptibility;
- a second tracking member having a second magnetic susceptibility different than the first magnetic susceptibility; and
- wherein the first tracking member is configured to be moved relative to the second tracking member, thereby altering local magnetic fields produced by the tracking system when the tracking system is positioned in the external magnetic field.

12. A method for producing images of a volume-of-interest with a magnetic resonance imaging (MRI) system using a spatial-encoding device having coupled thereto spatial-encoding elements that produce spatial-encoding magnetic fields when exposed to a magnetic field of the MRI system, the steps of the method comprising:
- a) providing to a volume-of-interest within the MRI system, the spatial-encoding device having coupled thereto spatial-encoding elements that generate a spatial-encoding magnetic field when positioned in the main magnetic field of the MRI system;
- b) operating the spatial-encoding device to adjust an orientation of the spatial-encoding elements relative to the main magnetic field of the MRI system in order to generate the spatial-encoding magnetic field;
- c) acquiring with the MRI system, signal data from spins adjacent the spatial-encoding device, the signal data being spatially encoded by the spatial-encoding magnetic field produced by the spatial-encoding device;
- d) repeating steps b) and c) while adjusting the orientation of the spatial-encoding elements relative to the main magnetic field of the MRI system to produce a different spatial-encoding magnetic field during each repetition in order to acquire spatially-encoded signal data;
- e) reconstructing an image of the volume-of-interest from the signal data acquired in steps b)-d).

13. The method as recited in claim 12 in which step e) includes solving a system of equations that relate acquired signal values to reconstructed image values and to an encoding matrix that accounts for spatial encoding provided by the spatial-encoding magnetic fields produced by the spatial-encoding device.

14. The method as recited in claim 13 in which the encoding matrix includes entries for each of the different spatial-encoding magnetic fields.

15. The method as recited in claim 14 in which the entries in the encoding matrix include information about a position and an orientation of the spatial-encoding device.

16. The method as recited in claim 12 in which step e) includes solving a system of equations that relate reconstructed image values to acquired signal values and to a decoding matrix that accounts for spatial encoding provided by the spatial-encoding magnetic fields produced by the spatial-encoding device as a function of a position and orientation of the spatial-encoding device relative to the main magnetic field of the MRI system.

17. The method as recited in claim 16 in which step e) includes calculating values of the decoding matrix such that a spatial response function for each voxel location in the reconstructed image is substantially localized to the corresponding voxel.

18. The method as recited in claim 17 in which the values of the decoding matrix are calculated from an encoding matrix that is estimated from discretized phase evolution maps.

19. The method as recited in claim 17 in which the encoding matrix is estimated using truncated singular value decomposition and Tikhonov regularization.

20. The method as recited in claim 17 in which the values of the decoding matrix are calculated by minimizing a least-squares error between an ideal spatial response function and a calculated spatial response function for each voxel in the reconstructed image.

\* \* \* \* \*